(12) United States Patent
Kobayashi

(10) Patent No.: US 10,361,236 B2
(45) Date of Patent: Jul. 23, 2019

(54) SEMICONDUCTOR APPARATUS AND EQUIPMENT HAVING LAMINATED LAYERS

(71) Applicant: CANON KABUSHIKI KAISHA, Tokyo (JP)

(72) Inventor: Masahiro Kobayashi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/928,997

(22) Filed: Mar. 22, 2018

(65) Prior Publication Data
US 2018/0286910 A1    Oct. 4, 2018

(30) Foreign Application Priority Data

Mar. 30, 2017    (JP) .................................. 2017-068690

(51) Int. Cl.
*H01L 27/146* (2006.01)
(52) U.S. Cl.
CPC .. *H01L 27/14636* (2013.01); *H01L 27/14603* (2013.01); *H01L 27/14609* (2013.01); *H01L 27/14621* (2013.01); *H01L 27/14627* (2013.01)
(58) Field of Classification Search
CPC ......... H01L 27/14636; H01L 27/14609; H01L 27/14603; H01L 27/14627
See application file for complete search history.

(56) References Cited

U.S. PATENT DOCUMENTS

| 6,771,348 | B2* | 8/2004 | Oh ...................... G02F 1/13452 174/258 |
| 7,378,747 | B2* | 5/2008 | Kim ...................... H01L 23/367 257/786 |
| 7,495,206 | B2* | 2/2009 | Park .................. H01L 27/14634 250/214.1 |
| 7,855,455 | B2* | 12/2010 | Purushothaman .. H01L 21/6835 257/750 |
| 9,153,490 | B2* | 10/2015 | Mitsuhashi ....... H01L 27/14627 |
| 9,774,801 | B2* | 9/2017 | Hseih ................. H04N 5/23235 |
| 2006/0165294 | A1 | 7/2006 | Mizuno et al. |

(Continued)

FOREIGN PATENT DOCUMENTS

| JP | 4012743 B2 | 11/2007 |
| JP | 2011151375 A | 8/2011 |

(Continued)

*Primary Examiner* — William Coleman
(74) *Attorney, Agent, or Firm* — Canon U.S.A., Inc. IP Division

(57) ABSTRACT

In a semiconductor apparatus including: a semiconductor substrate in which a plurality of semiconductor elements are provided; a first semiconductor layer which is overlapped on the semiconductor substrate and in which a plurality of photoelectric conversion elements are provided; a second semiconductor layer that is arranged between the semiconductor substrate and the first semiconductor layer; a first wiring structure that is arranged between the first semiconductor layer and the second semiconductor layer; a second wiring structure that is arranged between the second semiconductor layer and the semiconductor substrate; and a third wiring structure that is arranged between the second wiring structure and the semiconductor substrate, widths of a plurality of through electrodes are different from each other.

30 Claims, 7 Drawing Sheets

(56) References Cited

U.S. PATENT DOCUMENTS

| | | |
|---|---|---|
| 2010/0276572 A1 | 11/2010 | Iwabuchi et al. |
| 2011/0157445 A1 | 6/2011 | Itonaga et al. |
| 2011/0233702 A1 | 9/2011 | Takahashi et al. |
| 2012/0267740 A1 | 10/2012 | Okamoto |
| 2014/0285703 A1 | 9/2014 | Kizu et al. |
| 2015/0035109 A1 | 2/2015 | Kataoka |
| 2015/0270307 A1 | 9/2015 | Umebayashi et al. |
| 2016/0211299 A1 | 7/2016 | Arita |
| 2016/0254299 A1 | 9/2016 | Gomi |
| 2017/0170215 A1* | 6/2017 | Chu .................. H01L 27/1462 |

FOREIGN PATENT DOCUMENTS

| | | |
|---|---|---|
| JP | 2011204915 A | 10/2011 |
| JP | 2012227328 A | 11/2012 |
| JP | 2013219319 A | 10/2013 |
| JP | 2014099582 A | 5/2014 |
| JP | 2014195112 A | 10/2014 |
| JP | 2014209170 A | 11/2014 |
| JP | 2015070591 A | 4/2015 |
| JP | 2015115420 A | 6/2015 |
| JP | 2016171297 A | 9/2016 |
| JP | 2017059834 A | 3/2017 |

* cited by examiner

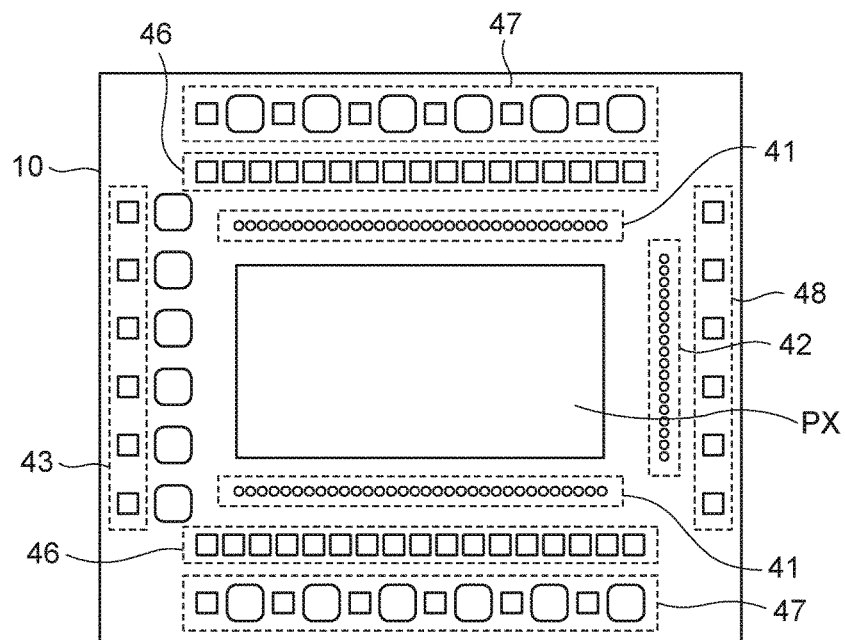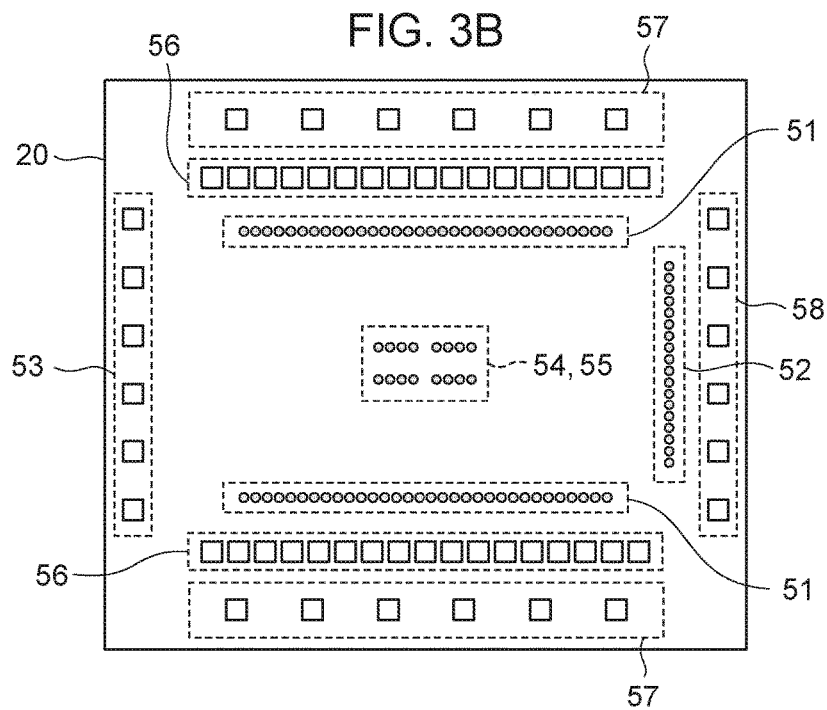

SEMICONDUCTOR APPARATUS AND EQUIPMENT HAVING LAMINATED LAYERS

BACKGROUND

Field of the Disclosure

The present disclosure relates to a semiconductor apparatus in which a plurality of semiconductor layers are laminated.

Description of the Related Art

In a semiconductor apparatus, by laminating a plurality of semiconductor layers, it is possible to reduce a size of the semiconductor apparatus or enhance performance thereof while suppressing an increase in the size thereof. In Japanese Patent Laid-Open No. 2014-99582, a solid-state imaging apparatus in which semiconductor substrates are laminated so as to form three layers is disclosed.

In a technique of Japanese Patent Laid-Open No. 2014-99582, connection between the substrates is not examined, and there is yet room for reduction of a size of the apparatus and/or enhancement of performance thereof.

SUMMARY

The disclosure provides a semiconductor apparatus that achieves reduction in a size thereof and/or enhancement of performance thereof.

In order to solve the aforementioned, a semiconductor apparatus including: a semiconductor substrate in which a plurality of semiconductor elements are provided; a first semiconductor layer which is overlapped on the semiconductor substrate and in which a plurality of photoelectric conversion elements are provided; a second semiconductor layer that is arranged between the semiconductor substrate and the first semiconductor layer; a first wiring structure that is arranged between the first semiconductor layer and the second semiconductor layer; a second wiring structure that is arranged between the second semiconductor layer and the semiconductor substrate; and a third wiring structure that is arranged between the second wiring structure and the semiconductor substrate is provided.

In a first aspect, the first semiconductor layer includes a first main surface on a side of the first wiring structure, the first wiring structure includes a first wiring, the second semiconductor layer includes a second main surface on a side of the second wiring structure, the second wiring structure includes a second wiring, the third wiring structure includes a third wiring, a through electrode that passes through the first semiconductor layer and reaches the first wiring and a through electrode that passes through the second semiconductor layer and reaches the third wiring are further included, and a width, on the first main surface, of the through electrode reaching the first wiring is different from a width, on the second main surface, of the through electrode reaching the third wiring.

In a second aspect, the first semiconductor layer includes a first main surface on a side of the first wiring structure, the first wiring structure includes a first wiring and a second wiring, the second semiconductor layer includes a second main surface on a side of the second wiring structure, the third wiring structure includes a third wiring that is electrically connected to the first wiring and a fourth wiring that is electrically connected to the second wiring, a through electrode that passes through the first semiconductor layer and reaches the first wiring and a through electrode that passes through the first semiconductor layer and reaches the second wiring are included, and a width, on the first main surface, of the through electrode reaching the first wiring is different from a width, on the first main surface, of the through electrode reaching the second wiring.

In a third aspect, the first semiconductor layer includes a first main surface on a side of the first wiring structure, the first wiring structure includes a first wiring, the second semiconductor layer includes a second main surface on a side of the second wiring structure, the second wiring structure includes a second wiring, the third wiring structure includes a third wiring that is electrically connected to the first wiring and a fourth wiring that is electrically connected to the second wiring, a through electrode that passes through the second semiconductor layer and reaches the third wiring and a through electrode that passes through the second semiconductor layer and reaches the fourth wiring are included, and a width, on the second main surface, of the through electrode reaching the third wiring is different from a width, on the second main surface, of the through electrode reaching the fourth wiring.

In a fourth aspect, an equipment comprising the above-mentioned semiconductor apparatus can be provided.

Further features of the present disclosure will become apparent from the following description of exemplary embodiments with reference to the attached drawings.

BRIEF DESCRIPTION OF THE DRAWINGS

FIGS. 3A and 3B are schematic views for explaining the semiconductor apparatus, according to one embodiment of the subject disclosure.

DESCRIPTION OF THE EMBODIMENTS

Hereinafter, forms for implementing the disclosure will be described with reference to drawings. Note that, in the description and the drawings below, a common reference sign will be assigned to a common constituent among a plurality of drawings. Accordingly, the common constituent will be described by mutually referring to the plurality of drawings, and description for the constituent to which the common reference sign is assigned will be omitted as appropriate. Moreover, it is possible to distinguish between constituents, which have similar names and to which different reference signs are assigned, for example, by referring to the constituents as a first constituent, a second constituent, a third constituent, and the like.

Common Embodiment

Figure 1:
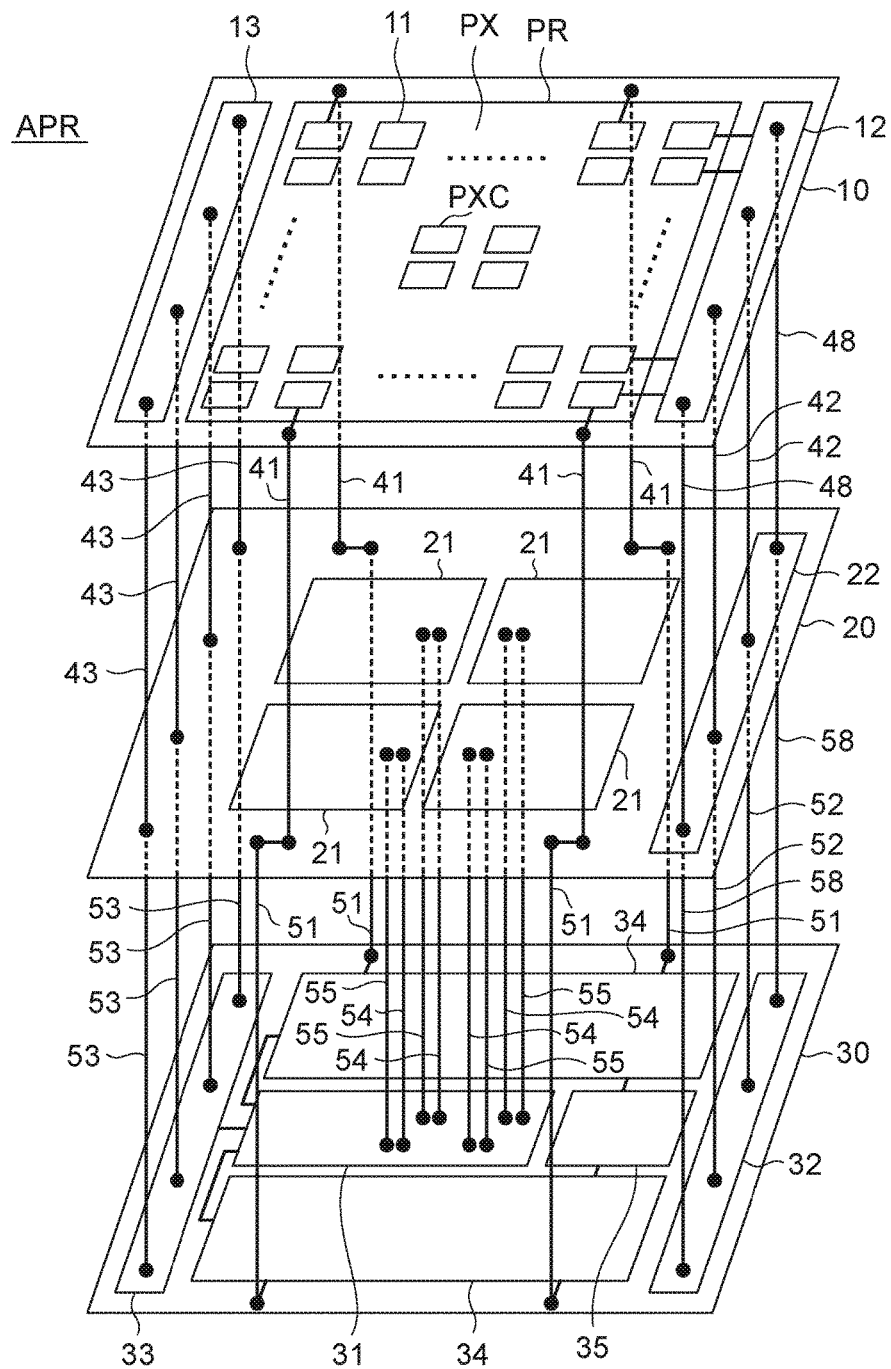
FIG. 1 is a schematic view for explaining a semiconductor apparatus, according to one embodiment of the subject disclosure.

FIG. 1 is a schematic view of a semiconductor apparatus APR according to exemplary embodiments of the disclosure. In the semiconductor apparatus APR, a chip 10, a chip 20, and a chip 30 are overlapped. Each of the chips 10, 20, and 30 is provided with a semiconductor integrated circuit. The chip 20 is positioned between the chip 10 and the chip 30. The chip 10, the chip 20, and the chip 30 have shapes whose outer edges are substantially shared. A direction in which the chip 10, the chip 20, and the chip 30 are laminated is referred to as a lamination direction, and a direction orthogonal to the lamination direction is referred to as a plane direction. In the description below, two overlapping constituents means a relation that a projection of one of the two constituents is projected to the other of the two constituents, and the projection at this time is projected in the lamination direction, unless otherwise noted.

The chip 10 includes a pixel circuit unit 11 in which pixel circuits PXC each including photoelectric conversion elements are two-dimensionally arrayed. A region in which the pixel circuit unit 11 is provided and the photoelectric conversion elements are arrayed is referred to as a pixel region PX. The chip 10 includes a peripheral region PR around the pixel region PX. The semiconductor apparatus APR in which the photoelectric conversion elements are provided is able to be used as a photoelectric conversion apparatus or an imaging apparatus. In the peripheral region PR, a through electrode is provided. Moreover, in the peripheral region PR, a drive circuit unit 12 that drives each of the pixel circuits PXC and an interface unit 13 that supplies power from an outside of the semiconductor apparatus APR and inputs/outputs a signal.

The chip 20 is provided with a storage circuit unit 21 and a drive circuit unit 22 that drives each of the pixel circuits PXC.

The chip 30 is provided with an operation circuit unit 31, a drive circuit unit 32 that drives the pixel circuit unit 11, an interface unit 33 that supplies power from the outside of the semiconductor apparatus APR and inputs/outputs a signal, a column circuit unit 34, and a control circuit unit 35. The operation circuit unit 31 may have a configuration of a logic circuit for performing image processing. In the column circuit unit 34, a plurality of column circuits corresponding to columns of the pixel circuit unit 11 are arrayed. Each of the plurality of column circuits is configured to perform signal processing such as correlated double sampling (CDS) processing, amplification processing, or AD (Analog-Digital) conversion processing.

Note that, functions of the chip 20 and the chip 30, which are described above, may be at least partially exchanged. For example, the storage circuit unit 21 may be provided to the chip 30 and the operation circuit unit 31 may be provided to the chip 20.

An operation of the semiconductor apparatus APR will be simply described. First, a pixel signal that is an analog signal is output from the pixel circuit unit 11 to the photoelectric conversion elements of the pixel circuit unit 11 in accordance with reception of light. The pixel signal is input to the column circuit unit 34, CDS processing, amplification processing, AD conversion processing, or the like is performed therefor, and digital data is generated. The digital data is input to the operation circuit unit 31. The digital data input to the operation circuit unit 31 is subjected to signal processing, and, at this time, the digital data is temporarily stored in the storage circuit unit 21 from the operation circuit unit 31. A digital signal output from the operation circuit unit 31 is converted, by the interface unit 13, into a signal suitable for differential transmission such as LVDS, and output to the outside.

Figure 2A:
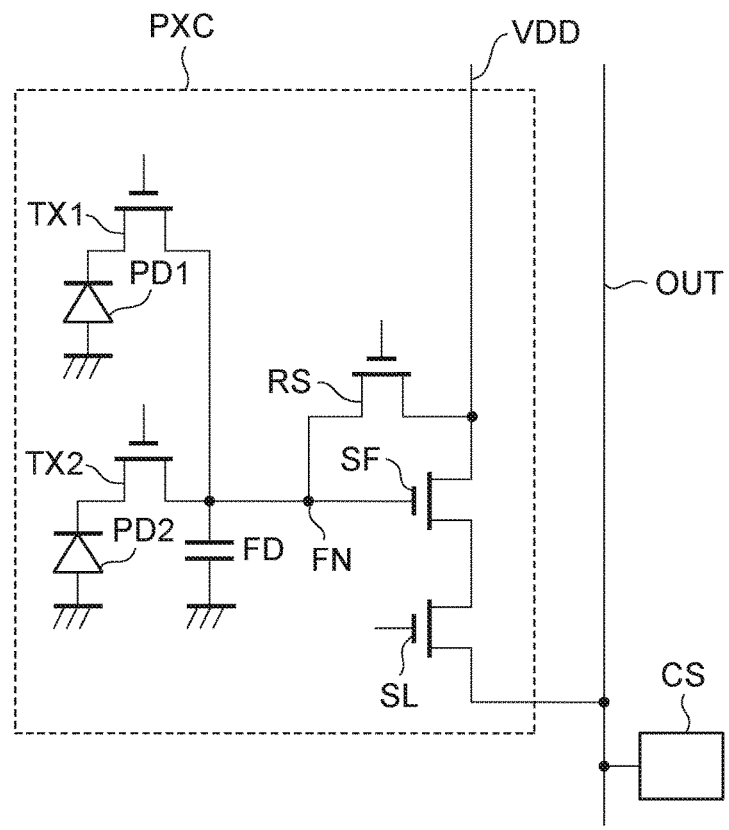
FIGS. 2A and 2B are schematic views for explaining the semiconductor apparatus, according to one embodiment of the subject disclosure.

FIG. 2A illustrates an example of the pixel circuit PXC. The pixel circuit PXC includes a photoelectric conversion element PD1, a photoelectric conversion element PD2, a transfer gate TX1, a transfer gate TX2, and a capacitive element FD. Moreover, the pixel circuit PXC is able to include an amplification transistor SF, a reset transistor RS, and a selection transistor SL. Each of the photoelectric conversion elements PD1 and PD2 is a photodiode or a photo gate. The transfer gates TX1 and TX2 are MIS (Metal-Insulator-Semiconductor) gates, and the amplification transistor SF, the reset transistor RS, and the selection transistor SL are MIS transistors. The amplification transistor SF may be a junction field effect transistor. In the present example, two photoelectric conversion elements PD1 and PD2 share one amplification transistor SF, but three or more photoelectric conversion elements may share one amplification transistor SF or the amplification transistor SF may be provided for each of the photoelectric conversion elements PD1 and PD2.

A signal charge generated in the photoelectric conversion element PD1 or PD2 is transferred to a floating node FN of the capacitive element FD via the transfer gate TX1 or TX2. A gate of the amplification transistor SF that constitutes a source follower circuit with a current source CS is connected to the floating node FN, and a pixel signal serving as a voltage signal is output to a signal output line OUT. The reset transistor RS resets an electric charge and potential of the floating node FN, and the selection transistor SL switches connection between the amplification transistor SF and the signal output line OUT. The reset transistor RS and the amplification transistor SF are connected to a power supply line VDD. The signal output line OUT and the power supply line VDD are provided for each of the columns of the pixel circuits PXC. A common power supply line (not illustrated) for supplying power to the power supply line VDD provided in each of the columns in common is able to be provided in the chip 10, or is able to be provided in the chip 20 or the chip 30. It is thereby possible to reduce crawling of the power supply lines in the chip 10, thus making it possible to achieve an effect of reduction in magnetic noise.

Figure 2B:
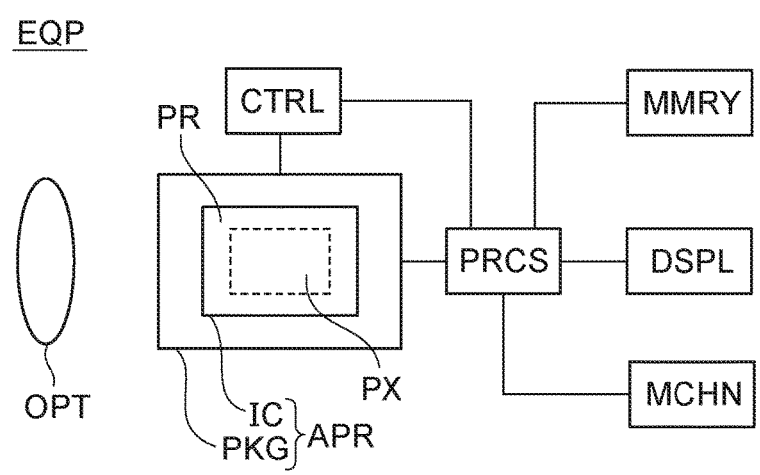

FIG. 2B illustrates an example of equipment EQP that is provided with the semiconductor apparatus APR. In addition to a semiconductor device IC in which the chip 10, the chip 20, and the chip 30 are laminated, the semiconductor apparatus APR is able to include a package PKG that stores the semiconductor device IC therein. The equipment EQP may further include at least one of an optical system OPT, a control apparatus CTRL, a processing apparatus PRCS, a display apparatus DSPL, a memory apparatus MMRY, and a machine apparatus MCHN. The equipment EQP will be described below in detail.

The semiconductor apparatus APR includes a plurality of through electrodes with which at least two of the chip 10, the chip 20, and the chip 30 are electrically connected. Each of the through electrodes passes through a semiconductor layer included in the chip 10 and/or a semiconductor layer included in the chip 20. Each of the semiconductor layers is typically a silicon layer (single-crystal silicon layer), so that the through electrode is also able to be referred to as a TSV (Through Silicon Via). Note that, the through electrode and a semiconductor element of the semiconductor layer are insulated by an insulator (not illustrated) provided on a side wall of a through hole through which the through electrode is provided or an isolating groove (not illustrated) provided in the semiconductor layer.

FIG. 1 schematically illustrates the plurality of through electrodes. The pixel circuit unit 11 and the column circuit unit 34 are connected via through electrodes 41 and through electrodes 51. The drive circuit unit 12 and the drive circuit unit 22 are connected via through electrodes 42 and 48. The through electrodes 42 have a function of transmitting a signal between the drive circuit units 12 and 22. The through electrodes 48 have a function of supplying power between the drive circuits 12 and 22. The drive circuit unit 22 and the drive circuit unit 32 are connected via through electrodes 52 and 58. The through electrodes 52 have a function of transmitting a signal between the drive circuit units 22 and 32. The through electrodes 58 have a function of supplying power between the drive circuit units 22 and 32.

The interface unit 13 and the interface unit 33 are connected via through electrodes 43 and through electrodes 53. The storage circuit unit 21 and the operation circuit unit 31 are connected via through electrodes 54 and through electrodes 55. The through electrodes 54 transmit data from the operation circuit unit 31 to the storage circuit unit 21, and the through electrodes 55 transmit data from the storage circuit unit 21 to the operation circuit unit 31. The through electrodes achieve electrical connection between the above-described units.

Changing widths of the through electrodes in accordance with functions, the number, or positions thereof is effective for reduction in a size of the semiconductor apparatus APR and/or enhancement of performance thereof. When the widths of all the through electrodes are made the same, while design is simplified, a function, performance, or a technical node of each chip is limited.

For example, in a case where the number of through electrodes of the same type which are arrayed in a column is large, for optimizing the number of through electrodes, widths of the through electrodes can be made narrower than those of a case where the number of through electrodes is small. Moreover, for improving bonding strength between chips, a width of a through electrode that is closer to an outer edge of a semiconductor chip can be made wider than that of a through electrode that is closer to an inner side of the semiconductor chip. In addition, for reducing stress generated in the semiconductor apparatus APR, a width of a through electrode on a chip in which a larger number of through electrodes are provided can be made narrower. Typically, only due to through electrodes 73 and 74, the chip 20 has the larger number of through electrodes than the chip 10. Accordingly, from a perspective of reduction in stress, a width of a through electrode that passes through a semiconductor layer 200 can be made narrower than a width of a through electrode that passes through a semiconductor layer 100. From a perspective of reduction in resistance, a width of a long through electrode can be made wider than that of a short through electrode. Since a through electrode that transmits a digital signal is required to perform high-speed transmission, for reducing resistance and thereby reducing RC delay, a width thereof can be made wider than that of a through electrode that transmits an analog signal for which only low-speed transmission is required.

When one through electrode of two through electrodes to be compared has a width which is 1.1 times of a width of the other through electrode or more, or the other through electrode has the width which is 0.9 time of the width of the one through electrode or less, it is possible to say that the widths of the two through electrodes are effectively different. In comparison of widths of through electrodes, a difference within ±1% is able to be regarded as an error or a fine difference. Note that, in a case where a cross-section of a through electrode has a shape other than a round shape, for example, such as a rectangular shape or an elliptic shape, the through electrode has a maximum width and a minimum width. In this case, a width of the through electrode is to be defined not by the minimum width but by the maximum width. Through electrodes of respective chips are able to be classified into two types of thick through electrodes and fine through electrodes. As a method of the classification, first, among all the through electrodes that pass through a semiconductor layer of each of the chips, a width of a through electrode having a widest width is set as a maximum width Wmax, and a width of a through electrode having a narrowest width is set as a minimum width Wmin. Then, a middle value (average value) of the maximum width Wmax and the minimum width Wmin is set as a reference width Wmid (Wmid=(Wmax+Wmin)/2) which is a virtual reference value. A through electrode having a width equal to or more than the reference width Wmid is able to be defined as a thick through electrode and a through electrode having a width less than the reference width Wmid is able to be defined as a fine through electrode. Thereby, even in a case where the number of types of widths of through electrodes is set to be three or more, it is possible to easily compare the number of fine through electrodes and the number of thick through electrodes. From a perspective of reduction in stress generated in the chip, the number of thick through electrodes can be made smaller than the number of fine through electrodes.

FIG. 3A illustrates planar arrangement of the through electrodes 41, 42, 43, 46, 47, and 48 in the chip 10. In FIG. 3A, each of the through electrodes 41 and 42 is illustrated with a circle, and each of the through electrodes 43, 46, 47, and 48 is illustrated with a square. A width of each of the through electrodes 41 and 42 is narrower than that of each of the through electrodes 43, 46, 47, and 48.

FIG. 3B illustrates planar arrangement of the through electrodes 51, 52, 53, 54, 55, 56, 57, and 58 in the chip 20. In FIG. 3B, each of the through electrodes 51, 52, 54, and 55 is illustrated with a circle, and each of the through electrodes 53, 56, 57, and 58 is illustrated with a square. A width of each of the through electrodes 51, 52, 54, and 55 is narrower than that of each of the through electrodes 53, 56, 57, and 58.

The through electrodes 46 and 56 have a function of supplying power from the chip 30 to the pixel circuit unit 11 and supplying power from the chip 30 to the storage circuit unit 21 in FIG. 3A, each rounded-corner quadrilateral indicates a pad opening. The through electrodes 43, 53, 47, and 57 have a function of connecting pads arranged in bottoms of the pad openings and the chip 30.

The through electrodes 43 are arranged closer to an outer edge of the chip 10 compared with adjacent pad openings. Pad openings adjacent to the through electrodes 47 are alternately arranged with the through electrodes 47 along the outer edge. The pad openings adjacent to the through electrodes 47 are arranged closer to the outer edge of the chip 10 compared with the through electrodes 46.

The through electrodes 41 are required as many as the number of columns of the pixel circuits PXC, and when it is considered that the number of columns of the pixel circuits PXC is set as about 1000 to 10000, the width of each of the through electrodes 41 can be made narrow as much as possible in order to increase the number of the through electrodes 41. Similarly, the through electrodes 42 are required as many as the number of rows of the pixel circuits PXC, and when it is considered that the number of rows of the pixel circuits PXC is set as about 1000 to 10000, the width of each of the through electrodes 42 can be made narrow as much as possible in order to increase the number of through electrodes 42. Although FIG. 3A schematically illustrates 82 through electrodes 41 and 42, approximately 1000 to 100000 through electrodes 41 and 42 are required realistically in total. The same applies to the through electrodes 51 and 52. On the other hand, since the through electrodes 43, 46, 47, and 48 are not required as many as the through electrodes 41 and 42, by increasing the widths thereof, resistance can be reduced compared with that of the through electrodes 41 and 42 and reliability of connection can be improved compared with that of the through electrodes 41 and 42. Although FIG. 3A schematically illustrates 58 through electrodes 43, 46, and 47, approximately only 100 to 1000 through electrodes 43, 46, and 47 are required realistically in total. A distance between each of the through electrodes 43, 46, 47, and 48 whose widths are relatively wider and the outer edge of the chip 10 is shorter than a distance between each of the through electrodes 41 and 42 whose widths are relatively narrower and the outer edge of the chip 10. By arranging the through electrodes 43, 46, 47, and 48 whose widths are relatively wider on an outer side in the chip 10, it is possible to arrange the through electrodes 43, 46, 47, and 48 whose widths are relatively wider as many as possible. Moreover, by arranging the through electrodes 43, 46, 47, and 48 whose widths are relatively wider on the outer side in the chip 10, it is possible to relax stress generated in the chip 10. The same applies to the chip 20. The through electrodes 54 and 55 are positioned immediately below the pixel region PX and arranged in a center part of the chip 20, and therefore have relatively narrower widths in order to reduce influence on the pixel circuit unit 11 of the pixel region PX and the stress generated in the chip 20.

As illustrated in FIGS. 3A and 3B, the through electrodes 43, 46, 47, and 48 whose widths are wide compared with those of the through electrodes 41 and 42 are arranged on all of four sides of the chip 10 whose outer edge forms a quadrilateral. This will be described in detail. In FIG. 3A, the pixel region PX (not illustrated) is provided between an upper column and a lower column of the through electrodes 41 that are provided in two columns which are divided in upper and lower sides. As illustrated in FIG. 1, an outer edge of the pixel region PX is also a quadrilateral. Four sides of each of the outer edges of the chip 10 and the pixel region PX are referred to as an upper side, a lower side, a left side, and a right side. A column of the plurality of through electrodes 43 is arranged between the left side of the pixel region PX and the left side of the chip 10, and a column of the plurality of through electrodes 48 is arranged between the right side of the pixel region PX and the right side of the chip 10. Moreover, columns of the plurality of through electrodes 46 and 47 are arranged between the upper side of the pixel region PX and the upper side of the chip 10, and columns of the plurality of through electrodes 46 and 47 are arranged between the lower side of the pixel region PX and the lower side of the chip 10. By arranging the through electrodes 43, 46, 47, and 48 whose widths are wide on the four sides of the chip 10 in this manner, it is possible to equalize stress generated in the chip 10 and the entire semiconductor apparatus APR and improve reliability of the semiconductor apparatus APR. Note that, in the present example, the through electrodes 41 and 42 whose widths are narrow compared with those of the through electrodes 43, 46, 47, and 48 have comparatively small influence of stress and therefore are arranged only on the upper side, the lower side, and the right side and not arranged on the left side, but may be arranged on the four sides. The through electrodes 53, 56, 57, and 58 in the chip 20 are also arranged on four sides of the chip 20.

Hereinafter, a specific configuration of the semiconductor apparatus APR will be described by focusing on the through electrodes.

First Embodiment

Figure 4:
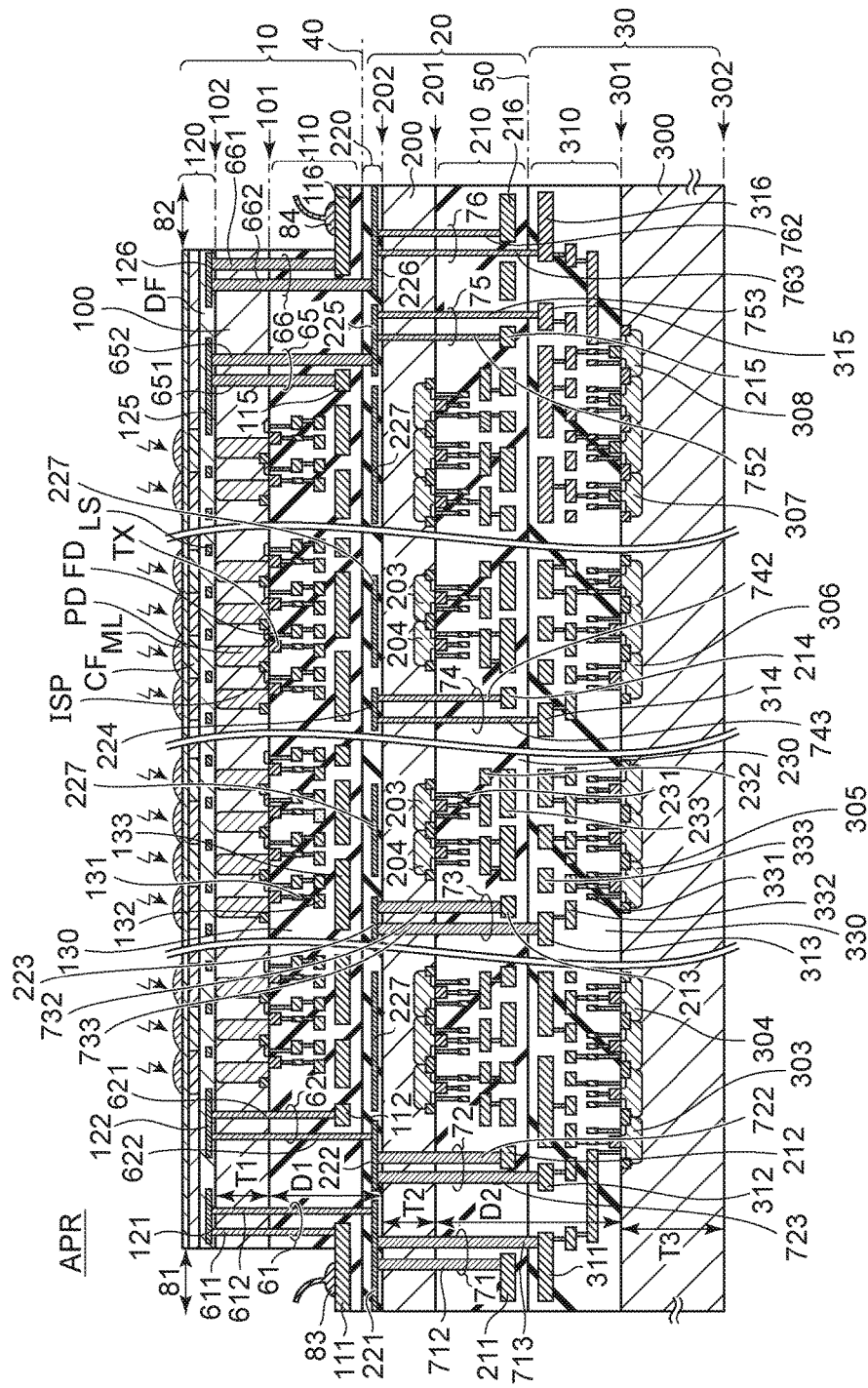
FIG. 4 is a schematic view for explaining a semiconductor apparatus according to an exemplary embodiment of the subject disclosure.

FIG. 4 is a cross-sectional view of the semiconductor apparatus APR according to a first exemplary embodiment. The chip 30 includes a semiconductor substrate 300 in which a plurality of semiconductor elements are provided. The chip 20 is overlapped on the semiconductor substrate 300, and includes the semiconductor layer 200 in which a plurality of semiconductor elements are provided. The chip 10 is overlapped on the semiconductor substrate 300, and includes a semiconductor layer 100 in which a plurality of photoelectric conversion elements PD are provided. The chip 10 and the chip 20 are bonded via a bonding surface 40, and the chip 20 and the chip 30 are bonded via a bonding surface 50. The bonding in the bonding surfaces 40 and 50 may be performed by direct bonding between insulators and/or between conductors, both of which are included in the chips 10, 20, and 30, or may be performed by bonding (adhesion) using a bonding material. Note that, in description below, it is set that wirings which are arranged on the same conductor layer and to which different reference signs are assigned constitute independent electric paths that are electrically isolated (insulated).

The semiconductor layer 100 of the chip 10 has transfer gates TX, the capacitive elements FD and element isolation units ISP in addition to the photoelectric conversion elements PD. Each of the element isolation units ISP is able to have an insulator isolation structure such as LOCOS or STI or a PN-junction isolation structure. The semiconductor layer 100 includes another transistor (not illustrated) for constituting the pixel circuit PXC.

The storage circuit unit 21 provided in the semiconductor layer 200 of the chip 20 includes a DRAM cell array in which a plurality of DRAM (Dynamic Random Access Memory) cells 203 are arrayed. A capacitor in each of the DRAM cells 203 may be a trench capacitor provided in the semiconductor layer 200 or a stacked capacitor provided on the semiconductor layer 200. The DRAM cell 203 includes a transistor that is a semiconductor element. Moreover, the storage circuit unit 21 includes a peripheral circuit which is arranged around the DRAM cell array and includes a transistor 204 as a semiconductor element.

The semiconductor substrate 300 of the chip 30 includes transistors 303, 304, 305, 306, 307, and 308 as semiconductor elements. As an example thereof, the transistor 303 is included in the interface unit 33 and the transistor 304 is included in the column circuit unit 34. Moreover, the transistors 305 and 306 are included in the operation circuit unit 31. The transistor 307 is included in the drive circuit unit 32 and the transistor 308 is included in the control circuit unit 35.

The chip 10 includes a wiring structure 110 arranged between the semiconductor layer 100 and the semiconductor layer 200. An integrated circuit provided in the chip 10 is constituted by the semiconductor layer 100 and the wiring structure 110. The wiring structure 110 includes a signal input line (not illustrated), the signal output line OUT, the power supply line VDD, and the like of the pixel circuit unit 11. The wiring structure 110 includes an insulator film 130 that includes a plurality of interlayer insulating layers, a conductor layer 131 which is mainly made of copper (Cu), a conductor layer 132 which is mainly made of copper (Cu), and a conductor layer 133 which is mainly made of aluminum (Al). The conductor layer 133 may be mainly made of copper (Cu). The plurality of conductor layers 131 and 132 are positioned between the conductor layer 133 and the semiconductor layer 100. The wiring structure 110 includes a plurality of wirings 111, 112, 115, and 116 in the present example, the plurality of wirings 111, 112, 115, and 116 are aluminum wiring patterns included in the conductor layer 133. Pad openings 81 and 82 from which the wiring 111 and the wiring 116 are respectively exposed to pass through the semiconductor layer 100 are respectively provided above the wiring 111 and the wiring 116. The wiring 111 and the wiring 116 are pads (bonding pads) to which bonding wires 83 and 84 are connected via the pad openings 81 and 82, respectively. The wiring 111 and the wiring 116 serving as the pads constitute the interface unit 13 described in FIG. 1. Note that, the pad openings 81 and 82 may be arranged in an inner side of the outer edge of the chip 10 to be surrounded by the semiconductor layer 100 as illustrated in FIG. 3A, or may be arranged so as to include the outer edge of the chip 10 as illustrated in FIG. 4.

Each of the wiring 111 and the wiring 116 may be a pad to which a bump is connected instead of the bonding wire 83 or 84. The bonding wire and the bump are able to be collectively called a connecting member with respect to an outside.

The chip 10 includes an optical structure 120 provided on a side opposite to the wiring structure 110 with respect to the semiconductor layer 100. The optical structure 120 includes a light-shielding member LS, a dielectric film DF, a color filter CF, and micro lenses ML. By causing one of the plurality of micro lenses ML to deal with the two photoelectric conversion elements PD1 and PD2 illustrated in FIG. 2A, it is also possible to perform focus detection by an image plane phase difference method. The semiconductor layer 100 has a front surface 101 serving as a main surface on a side of the wiring structure 110 and a rear surface 102 serving as a main surface on a side opposite to the front surface 101 (side of the optical structure 120). The semiconductor apparatus APR of the present exemplary embodiment is a back-side illuminated imaging apparatus in which the rear surface 102 serves as a light receiving surface. A plurality of wirings 121, 122, 125, and 126 are provided on the rear surface 102. The light-shielding member LS is mainly made of metal such as tungsten (W).

The chip 20 includes a wiring structure 210 arranged between the semiconductor layer 200 and the semiconductor substrate 300. An integrated circuit provided in the chip 20 is constituted by the semiconductor layer 200 and the wiring structure 210. The wiring structure 210 includes a word line and a bit line in the DRAM cell array of the storage circuit unit 21. The wiring structure 210 includes an insulator film 230 that includes a plurality of interlayer insulating layers, a conductor layer 231 which is mainly made of aluminum (Al), a conductor layer 232 which is mainly made of aluminum (Al), and a conductor layer 233 which is mainly made of aluminum (Al). The conductor layers 231, 232, and 233 may be mainly made of copper (Cu). The plurality of conductor layers 231 and 232 are positioned between the conductor layer 233 and the semiconductor layer 200. The wiring structure 210 includes a plurality of wirings 211, 212, 213, 214, 215, and 216. For example, the wirings 213 and 214 are connected to the transistor 204, and the wiring 215 is connected to a transistor included in the drive circuit unit 22. In the present example, the plurality of wirings 211, 212, 213, 214, 215, and 216 are aluminum wiring patterns included in the conductor layer 233.

The chip 20 includes a wiring structure 220 arranged between the semiconductor layer 200 and the wiring structure 110. The wiring structure 220 includes a plurality of wirings 221, 222, 223, 224, 225, and 226. The semiconductor layer 200 has a front surface 201 serving as a main surface on a side of the wiring structure 210 and a rear surface 202 serving as a main surface on a side opposite to the front surface 201 (side of the wiring structure 220). The wiring structure 220 includes a shading member 227. The shading member 227 functions as a light-shielding member that suppresses incidence of light transmitted through the semiconductor layer 100 on the semiconductor layer 200.

The chip 30 includes a wiring structure 310 arranged between the wiring structure 210 and the semiconductor substrate 300. An integrated circuit provided in the chip 30 is constituted by the semiconductor substrate 300 and the wiring structure 310. The wiring structure 310 includes an insulator film 330 that includes a plurality of interlayer insulating layers, a conductor layer 331 which is mainly made of copper (Cu), a conductor layer 332 which is mainly made of copper (Cu), and a conductor layer 333 which is mainly made of aluminum (Al). The conductor layer 333 may be mainly made of copper (Cu). The plurality of conductor layers 331 and 332 are positioned between the conductor layer 333 and the semiconductor substrate 300. The wiring structure 310 includes a plurality of wirings 311, 312, 313, 314, 315, and 316. For example, the wiring 311 is connected to the transistor 303, the wiring 312 is connected to the transistor 304, and the wiring 313 is connected to the transistor 305. Moreover, for example, the wiring 314 is connected to the transistor 306, the wiring 315 is connected to the transistor 307, and the wiring 316 is connected to the transistor 308. In the present example, the plurality of wirings 311, 312, 313, 314, 315, and 316 are aluminum wiring patterns included in the conductor layer 333. The semiconductor substrate 300 has a front surface 301 serving as a main surface on a side of the wiring structure 310 and a rear surface 302 serving as a main surface on a side opposite to the front surface 301.

The wiring 311 is electrically connected to the wirings 211, 221, 121, and 111. The wiring 312 is electrically connected to the wirings 212, 222, 122, and 112. The wiring 313 is electrically connected to the wirings 213 and 223. The wiring 314 is electrically connected to 214 and 224. The wiring 315 is electrically connected to the wirings 215, 225, 115, and 125. The wiring 316 is electrically connected to the wirings 216, 226, 116, and 126.

A case where the semiconductor elements to which the wirings included in the wiring structures 110, 210, and 310 are connected are transistors has been exemplified here. However, the semiconductor elements to which the wirings included in the wiring structures 110, 210, and 310 are connected are not limited to the transistors and may be diodes, capacitive elements, or resistive elements.

The semiconductor apparatus APR includes through electrodes 61, 62, 65, and 66. Each of the through electrodes 61, 62, 65, and 66 passes through the semiconductor layer 100. In the present example, the through electrode 61 is constituted by a pair of a through electrode 611 and a through electrode 612, and the through electrode 62 is constituted by a pair of a through electrode 621 and a through electrode 622. The through electrode 65 is constituted by a pair of a through electrode 651 and a through electrode 652, and the through electrode 66 is constituted by a pair of a through electrode 661 and a through electrode 662. Each of the pairs of through electrodes are electrically and mutually connected by each of the wirings 121, 122, 125, and 126. The through electrode 61 (through electrode 611) reaches the wiring 111, the through electrode 62 (through electrode 621) reaches the wiring 112, the through electrode 65 (through electrode 651) reaches the wiring 115, and the through electrode 66 (through electrode 661) reaches the wiring 116. Moreover, the through electrode 61 (through electrode 612) reaches the wiring 221, the through electrode 62 (through electrode 622) reaches the wiring 222, the through electrode 65 (through electrode 652) reaches the wiring 225, and the through electrode 66 (through electrode 662) reaches the wiring 226.

Although none of the through electrodes 61, 62, 65, and 66 is overlapped on any of through electrodes 71, 72, 75, and 76 in the present example, when the through electrodes 61, 62, 65, and 66 are overlapped on the through electrodes 71, 72, 75, and 76, it is possible to effectively utilize a limited space of the semiconductor apparatus APR, thus making it possible to make the through electrode thick as much as possible or increase the number of through electrodes. In the present example, the through electrodes 61, 62, 65, and 66 reach the wirings 221, 222, 225, and 226, respectively, but the wirings 221, 222, 225, and 226 may be omitted and the through electrodes 61, 62, 65, and 66 may reach the through electrodes 71 72, 75, and 76, respectively. In this case, the through electrodes 61, 62, 65, and 66 are overlapped on the through electrodes 71, 72, 75, and 76. Specifically, in order to respectively connect the wirings 111, 112, 115, and 116 to the wirings 211, 212, 213, and 214, the through electrodes 612, 622, 652, and 662 respectively reach through electrodes 712, 722, 752, and 762. Moreover, in order to respectively connect the wirings 111, 112, 115, and 116 to the wirings 311, 312, 313, and 314, the through electrodes 612, 622, 652, and 662 are respectively overlapped on through electrodes 713, 723, 753, and 763.

In the present example, the through electrodes 61, 62, 65, and 66 are mainly formed of copper (Cu), and the wirings 121, 122, 125, and 126 are mainly formed of tungsten (W). However, the through electrodes 61, 62, 65, and 66 and the wirings 121, 122, 125, and 126 are also able to be integrally formed of the same material. A main material of the through electrodes 61, 62, 65, and 66 that are integrally formed of the same material may also be copper (Cu) or tungsten (W), but, in order to reduce resistance of the through electrodes 61, 62, 65, and 66, the main material of the through electrodes 61, 62, 65, and 66 can be copper (Cu). Moreover, in the present example, the wirings 121, 122, 125, and 126 are formed in the same layer (tungsten layer) as the light-shielding member LS, but the wirings 121, 122, 125, and 126 and the light-shielding member LS may be formed in different layers whose materials are different. For example, the light-shielding member LS may be provided in the tungsten layer and the wirings 121, 122, 125, and 126 may be provided in a copper layer.

The semiconductor apparatus APR includes the through electrodes 71, 72, 73, 74, 75, and 76. Each of the through electrodes 71, 72, 73, 74, 75, and 76 passes through the semiconductor layer 200. In the present example, the through electrode 71 is constituted by a pair of the through electrode 712 and the through electrode 713, the through electrode 72 is constituted by a pair of the through electrode 722 and the through electrode 723. The through electrode 73 is constituted by a pair of a through electrode 732 and a through electrode 733, and the through electrode 74 is constituted by a pair of a through electrode 742 and a through electrode 743. The through electrode 75 is constituted by a pair of the through electrode 752 and the through electrode 753, and the through electrode 76 is constituted by a pair of the through electrode 762 and the through electrode 763. Each of the pairs of through electrodes are electrically and mutually connected by each of the wirings 221, 222, 223, 224, 225, and 226.

The through electrode 71 (through electrode 712) reaches the wiring 211, and the through electrode 72 (through electrode 722) reaches the wiring 212. The through electrode 73 (through electrode 732) reaches the wiring 213, and the through electrode 74 (through electrode 742) reaches the wiring 214. The through electrode 75 (through electrode 752) reaches the wiring 215, and the through electrode 76 (through electrode 762) reaches the wiring 216. The through electrode 71 (through electrode 713) reaches the wiring 311, and the through electrode 72 (through electrode 723) reaches the wiring 312. The through electrode 73 (through electrode 733) reaches the wiring 313, and the through electrode 74 (through electrode 743) reaches the wiring 314. The through electrode 75 (through electrode 753) reaches the wiring 315, and the through electrode 76 (through electrode 763) reaches the wiring 316. The through electrodes 73 and 74 are positioned between the pixel region PX and the semiconductor substrate 300.

In the present example, the through electrodes 71, 72, 73, 74, 75, and 76 are mainly formed of copper (Cu) and the wirings 221, 222, 223, 224, 225, and 226 are mainly formed of tungsten (W). However, the through electrodes 71, 72, 73, 74, 75, and 76 and the wirings 221, 222, 223, 224, 225, and 226 are also able to be integrally formed of the same material. A main material of the through electrodes 71, 72, 73, 74, 75, and 76 that are integrally formed of the same material may also be copper (Cu) or tungsten (W), but, in order to reduce resistance of the through electrodes 71, 72, 73, 74, 75, and 76, the main material of the through electrodes 71, 72, 73, 74, 75, and 76 can be copper (Cu).

The shading member 227 included in the wiring structure 220 is able to be caused to function as an electromagnetic wave shield member that suppresses generation of noise in a pixel signal due to incidence of an electromagnetic wave, which is generated in the chip 20 or 30, on the wiring structure 110 or the semiconductor layer 100. In order to adequately utilize the function as the electromagnetic wave shield member, fixed potential such as power supply potential or ground potential can be supplied to the shading member 227. The fixed potential applied to the shading member 227 is able to be supplied from a wiring included in the wiring structure 210 or the wring structure 310 to the shading member 227 via a through electrode (not illustrated) which passes through the semiconductor layer 200 in the present example, the wirings 221, 222, 223, 224, 225, and 226 are formed in the same layer (tungsten layer) as the shading member 227, but the wirings 221, 222, 223, 224, 225, and 226 and the shading member 227 may be formed in different layers whose materials are different. For example, the shading member 227 may be provided in the tungsten layer and the wirings 221, 222, 223, 224, 225, and 226 may be provided in a copper layer.

Although a through electrode is used for connecting a wiring of the wiring structure 210 and a wiring of the wiring structure 310 in the present exemplary embodiment, it is possible to realize the connection of the wiring of the wiring structure 210 and the wiring of the wiring structure 310 also by direct bonding of the wirings.

The through electrodes 61 and 66 are applicable to the above-described electrodes 43 and 47 (refer to FIG. 1 and FIG. 3A). The through electrodes 62 and 65 are applicable to the above-described through electrodes 41, 42, 46, and 48 (refer to FIG. 1 and FIG. 3A). The through electrodes 71 and 76 are applicable to the above-described through electrodes 53 and 57 (refer to FIG. 1 and FIG. 3B). The through electrodes 72 and 75 are applicable to the above-described through electrodes 51, 52, 56 and 58 (refer to FIG. 1 and FIG. 3B). The through electrodes 73 and 74 are applicable to the above-described through electrodes 54 and 55 (refer to FIG. 1 and FIG. 3B).

A thickness T2 of the semiconductor layer 200 is able to be thicker than a thickness T1 of the semiconductor layer 100 (T2>T1). The thickness T2 of the semiconductor layer 200 is able to be thinner than a thickness T3 of the semiconductor substrate 300 (T3>T2). When T2>T1 is satisfied, a length of a through electrode passing through the semiconductor layer 200 is likely to be longer than a length of a through electrode passing through the semiconductor layer 100. From a perspective of reduction in resistance of the through electrodes, a width of the long through electrode passing through the semiconductor layer 200 can be wider than a width of the short through electrode passing through the semiconductor layer 100. On the contrary, when T2<T1 is satisfied, the width of the through electrode passing through the semiconductor layer 100 can be wider than the width of the through electrode passing through the semiconductor layer 200. It is possible to set both of the thicknesses T1 and T2 to be 1 to 100 μm, preferably, 1 to 10 μm. A distance D1 between the semiconductor layer 100 and the semiconductor layer 200 and a distance D2 between the semiconductor layer 200 and the semiconductor substrate 300 are able to be set to be greater than the thicknesses T1 and T2, respectively (T1<D1, T2<D2). The distance D2 is able to be set to be longer than the distance D1 (D1<D2). For example, it is possible to satisfy T1<T2<D1<D2. It is possible to set the thickness T3 of the semiconductor substrate 300 to be greater than twice of a total distance from the semiconductor substrate 300 to the rear surface 102 of the semiconductor layer 100 (D2+T2+D1+T1) (2×((D2+T2+D1+T1)<T3). It is also possible to set the thickness T3 of the semiconductor substrate 300 to be smaller than 20 times of the total distance from the semiconductor substrate 300 to the rear surface 102 of the semiconductor layer 100 (D2+T2+D1+T1) (T3<20×((D2+T2+D1+T1)). When the thickness T3 is greater than twice of the total distance, even in a case where stress is caused in the two semiconductor layers 100 and 200 and wiring structures 110, 210, and 310, it is possible to suppress a warp thereof and achieve excellent support. Although the thickness T3 is desired to be greater than the total distance, when the thickness T3 is smaller than twice of the total distance, there is a possibility that a warp is caused in the semiconductor apparatus APR depending on a length of the semiconductor apparatus APR in a planar direction. When the length of each side of the semiconductor apparatus APR in the planar direction is equal to or less than 10 mm, it is possible to reduce an influence of the warp even in a case where the thickness T3 is smaller than twice of the total distance. By setting the thickness T3 to be smaller than 20 times of the total distance, it is possible to effectively reduce a thickness of the semiconductor apparatus APR and reduce the size of the semiconductor apparatus APR.

Hereinafter, a width of a through electrode will be described. In a first aspect, the width of the through electrode passing through the semiconductor layer 100 and the width of the through electrode passing through the semiconductor layer 200 are different. The widths of the through electrodes are to be compared by using the widths on the front surfaces of the respective semiconductor layers through which the through electrodes pass. The through electrodes whose widths are compared in the first aspect are to be through electrodes that are electrically connected to each other. Moreover, the through electrodes whose widths are to be compared are to be a through electrode that reaches a wiring included in the wiring structure 110 and a through electrode that reaches the wiring structure 310.

By setting a width of a through electrode that is relatively long to be wider than a width of a through electrode that is relatively short, it is possible to suppress an increase in resistance of the through electrodes. Moreover, by setting widths of through electrodes that are arranged at a relatively narrow pitch to be narrower than widths of through electrodes that are arranged at a relatively wide pitch, it is possible to increase the number of through electrodes and suppress a short between the through electrodes.

Specifically, a width of the through electrode 61 (in particular, the through electrode 611) on the front surface 101 is narrower than a width of the through electrode 71 (in particular, the through electrode 713) on the front surface 201. Similarly, a width of the through electrode 62 (in particular, the through electrode 621) on the front surface 101 is narrower than a width of the through electrode 72 (in particular, the through electrode 723) on the front surface 201. In a case where either or both of relations of T1<T2 and D1<D2 are satisfied, the through electrodes 71 and 72 may be longer than the through electrodes 61 and 62. Thus, in order to reduce resistance of the through electrodes 71 and 72, the widths of the through electrodes 71 and 72 can be set to be narrow. Such a combination of the through electrode 62 whose width is narrow and the through electrode 72 whose width is wide can be applied to combinations of the through electrodes 41 and 42 and the through electrodes 51 and 52 between which array pitches are narrow.

Moreover, a width of the through electrode 65 (in particular, the through electrode 651) on the front surface 101 is wider than a width of the through electrode 75 (in particular, the through electrode 753) on the front surface 201. Similarly, a width of the through electrode 66 (in particular, the through electrode 661) on the front surface 101 is wider than a width of the through electrode 76 (in particular, the through electrode 763) on the front surface 201.

It is considered that peeling between the chips is more likely to occur in the bonding surface 40 than in the bonding surface 50. Accordingly, by setting the widths of the through electrodes 65 and 66 passing through the semiconductor layer 100 to be wider than the widths of the through electrodes 75 and 76 passing through the semiconductor layer 200, it is possible to increase bonding strength in the bonding surface 40. Such a through electrode 65 or 66 whose width is wide can be applied to the through electrodes 43, 47, and 48 that are arranged at positions close to the outer edge of the chip 10.

Also in a second aspect, a width of a through electrode passing through the semiconductor layer 100 and a width of a through electrode passing through the semiconductor layer 200 are different. The widths of the through electrodes are to be compared by using the widths on the front surfaces of the respective semiconductor layers through which the through electrodes pass. Through electrodes whose widths are to be compared in the second aspect are to be through electrodes that are not electrically connected to each other. Moreover, the through electrodes whose widths are to be compared are to be a through electrode that reaches a wiring included in the wiring structure 110 and a through electrode that reaches the wiring structure 310.

Specifically, the width of the through electrode 61 (in particular, the through electrode 611) on the front surface 101 is narrower than a width of the through electrode 73 (in particular, the through electrode 733) on the front surface 201. Similarly, the width of the through electrode 62 (in particular, the through electrode 621) on the front surface 101 is narrower than the width of the through electrode 73 (in particular, the through electrode 733) on the front surface 201.

Moreover, the width of the through electrode 65 (in particular, the through electrode 651) on the front surface 101 is wider than a width of the through electrode 74 (in particular, the through electrode 743) on the front surface 201. Similarly, the width of the through electrode 66 (in particular, the through electrode 661) on the front surface 101 is wider than the width of the through electrode 74 (in particular, the through electrode 743) on the front surface 201. In order to suppress an increase in stress inside the chip 20, the through electrode 74 whose width is narrow can be applied to the through electrodes 54 and 55 that are arranged in the center part of the chip 20. The through electrode 73 whose width is wide can be applied to a through electrode that is arranged in a peripheral part in the chip 20.

In a third aspect, a width of a through electrode passing through the semiconductor layer 200 varies in accordance with a place or a function. Widths of through electrodes are to be compared by using the widths on the front surface 201 of the semiconductor layer 200.

Specifically, the width of the through electrode 71 (in particular, the through electrode 713) on the front surface 201 is wider than the width of the through electrode 74 (in particular, the through electrode 743) on the front surface 201. Similarly, the width of the through electrode 72 (in particular, the through electrode 723) on the front surface 201 is wider than the width of the through electrode 74 (in particular, the through electrode 743) on the front surface 201. The same applies to a relation between the through electrode 71 (in particular, the through electrode 713) or the through electrode 72 (in particular, the through electrode 723) and the through electrode 75 (in particular, the through electrode 753).

Moreover, the width of the through electrode 75 (in particular, the through electrode 753) on the front surface 201 is narrower than the width of the through electrode 73 (in particular, the through electrode 733) on the front surface 201. Similarly, the width of the through electrode 76 (in particular, the through electrode 763) on the front surface 201 is wider than the width of the through electrode 73 (in particular, the through electrode 733) on the front surface 201. The same applies to a relation between the through electrode 75 (in particular, the through electrode 753) or the through electrode 76 (in particular, the through electrode 763) and the through electrode 72 (in particular, the through electrode 723).

In a fourth aspect, a width of a through electrode passing through the semiconductor layer 100 varies in accordance with a place or a function. Widths of through electrodes are to be compared by using the widths on the front surface 101 of the semiconductor layer 100.

Specifically, the width of the through electrode 62 (in particular, the through electrode 621) on the front surface 101 is narrower than the width of the through electrode 66 (in particular, the through electrode 661) on the front surface 101. Similarly, the width of the through electrode 62 (in particular, the through electrode 621) on the front surface 101 is narrower than the width of the through electrode 65 (in particular, the through electrode 651) on the front surface 101.

Moreover, the width of the through electrode 65 (in particular, the through electrode 651) on the front surface 101 is wider than the width of the through electrode 61 (in particular, the through electrode 611) on the front surface 101. Similarly, the width of the through electrode 66 (in particular, the through electrode 661) on the front surface 101 is wider than the width of the through electrode 61 (in particular, the through electrode 611) on the front surface 101.

In the third and fourth aspects, proper use of the through electrode whose width is wide and the through electrode whose width is narrow is the same as what has been described by using FIGS. 3A and 3B.

Second Embodiment

Figure 5:
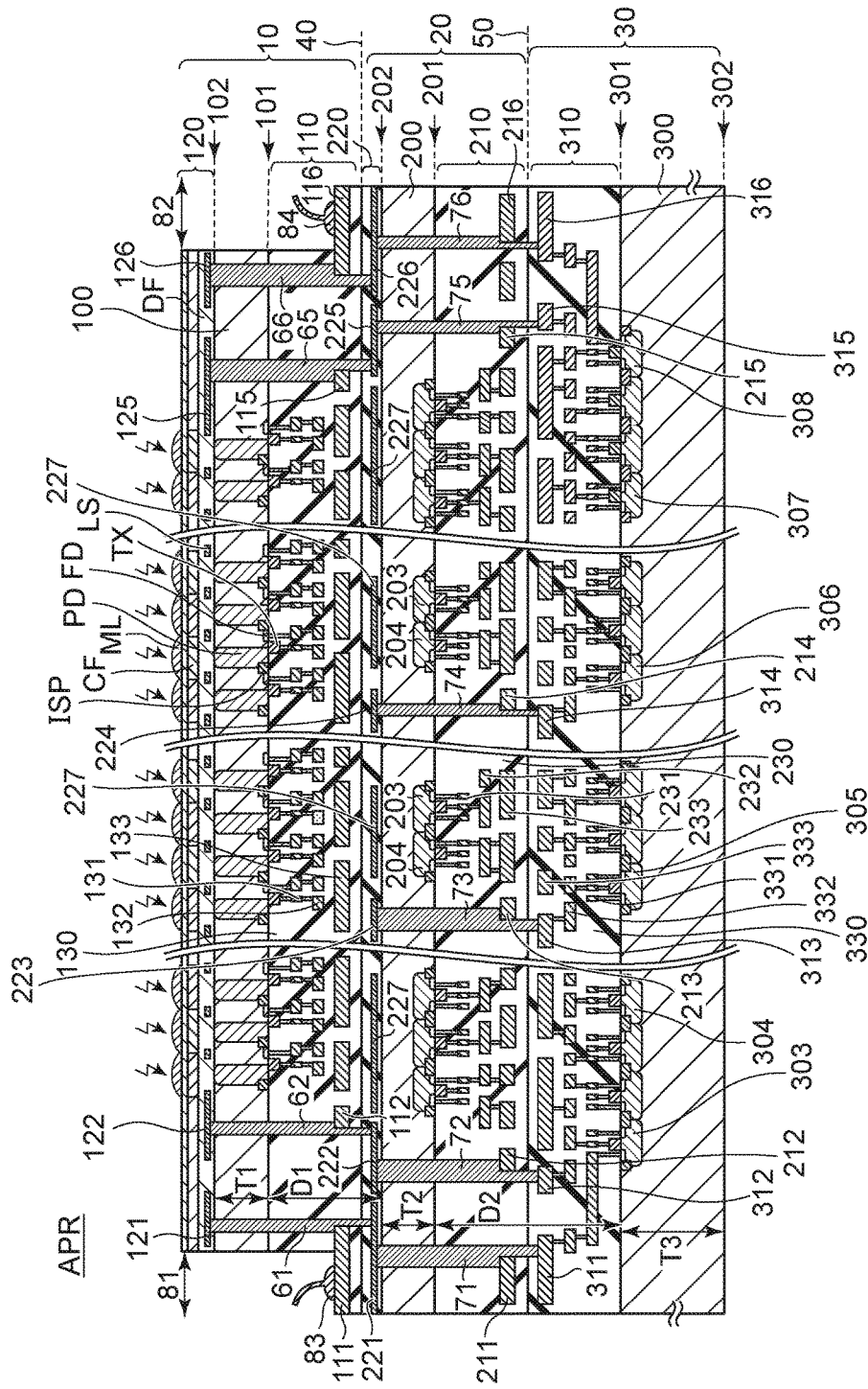
FIG. 5 is a schematic view for explaining a semiconductor apparatus according to an exemplary embodiment of the subject disclosure.

FIG. 5 is a cross-sectional view of the semiconductor apparatus APR according to a second exemplary embodiment. Description for points that may be similar to those of the first exemplary embodiment will be omitted.

The present exemplary embodiment is different from the first exemplary embodiment in that each of the through electrodes 61, 62, 65, and 66 each of which is constituted by a pair of through electrodes in the first exemplary embodiment is constituted by one through electrode. By connecting a wiring of the wiring structure 110 and a wiring of the wiring structure 220 in common by one through electrode in this manner, it is possible to reduce the number of through electrodes (approximately by half) and increase the number of connection between the chips within a limited space. Moreover, it is also possible to increase a thickness of a through electrode as much as possible or reduce an occupancy area of a through electrode. Similarly, each of the through electrodes 71, 72, 73, 74, 75, and 76 each of which is constituted by a pair of through electrodes in the first exemplary embodiment is constituted by one through electrode.

In the present example, the through electrodes 61, 62, 65, and 66 reach the wirings 221, 222, 225, and 226, respectively. However, the second exemplary embodiment is suitable for omitting the wirings 221, 222, 225, and 226 and overlapping the through electrodes 61, 62, 65, and 66 on the through electrodes 71, 72, 75, and 76, respectively. Thereby, it is possible to save a planar place occupied by the through electrodes, thus make it possible to, as much as possible, increase a width of a through electrode or increase the number of through electrodes. Particularly, the through electrodes 61, 62, 65, and 66 may reach the through electrodes 71, 72, 75, and 76, respectively.

Third Embodiment

Figure 6:
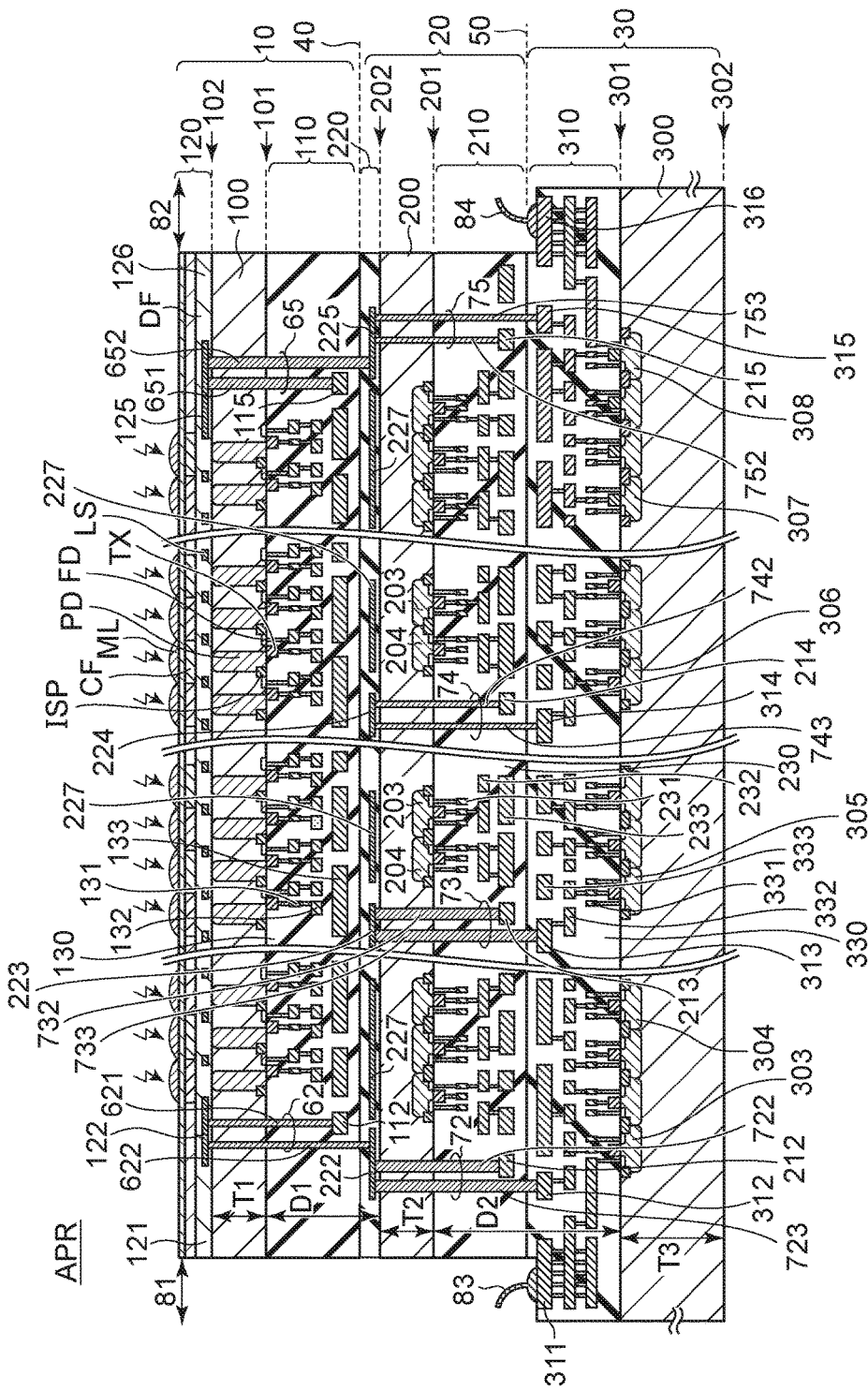
FIG. 6 is a schematic view for explaining a semiconductor apparatus according to an exemplary embodiment of the subject disclosure.

FIG. 6 is a cross-sectional view of the semiconductor apparatus APR according to a third exemplary embodiment. Description for points that may be similar to those of the first exemplary embodiment or the second exemplary embodiment will be omitted.

While the wirings 111 and 116 each serving as the pad are included in the wiring structure 110 in the first exemplary embodiment, each of the wirings 311 and 316 that are included in the wiring structure 310 serves as a pad (bonding pad) in the third exemplary embodiment. The wiring 311 and the wiring 316 each serving as the pad constitute the interface unit 33 described in FIG. 1. The bonding wires 83 and 84 are connected to the wirings 311 and 316 via the pad openings 81 and 82 above the wirings 311 and 316, respectively. The pad openings 81 and 82 in the present exemplary embodiment pass through not only the semiconductor layer 100 but also the semiconductor layer 200. In this manner, the wirings 311 and 316 each serving as the pad are provided in the wiring structure 310 that is close to the semiconductor substrate 300 in which the operation circuit unit 31 and the interface unit 33 are provided. Thereby, an electric path from the interface unit 33 to the pad is shortened, thus making it possible to speed up an input/output of a signal.

Note that, a modified example of the third exemplary embodiment, the wirings 211 and 216 that have been described in the first exemplary embodiment and are included in the wiring structure 210 may be used as pads. In this case, the wirings 211 and 216 serving as the pads are connected to the wirings 311 and 316 that are included in the wiring structure 310 via the through electrodes 71 and 76, respectively. Also in this case, similarly to the third exemplary embodiment, the pad openings 81 and 82 above the wirings 211 and 216 serving as the pads pass through not only the semiconductor layer 100 but also the semiconductor layer 200. It is thereby possible to reduce depths of the pad openings 81 and 82 compared with those of the exemplary embodiment of FIG. 5, thus facilitating connecting the bonding wires 83 and 84 to the wirings 211 and 216 serving as the pads.

Fourth Embodiment

Figure 7:
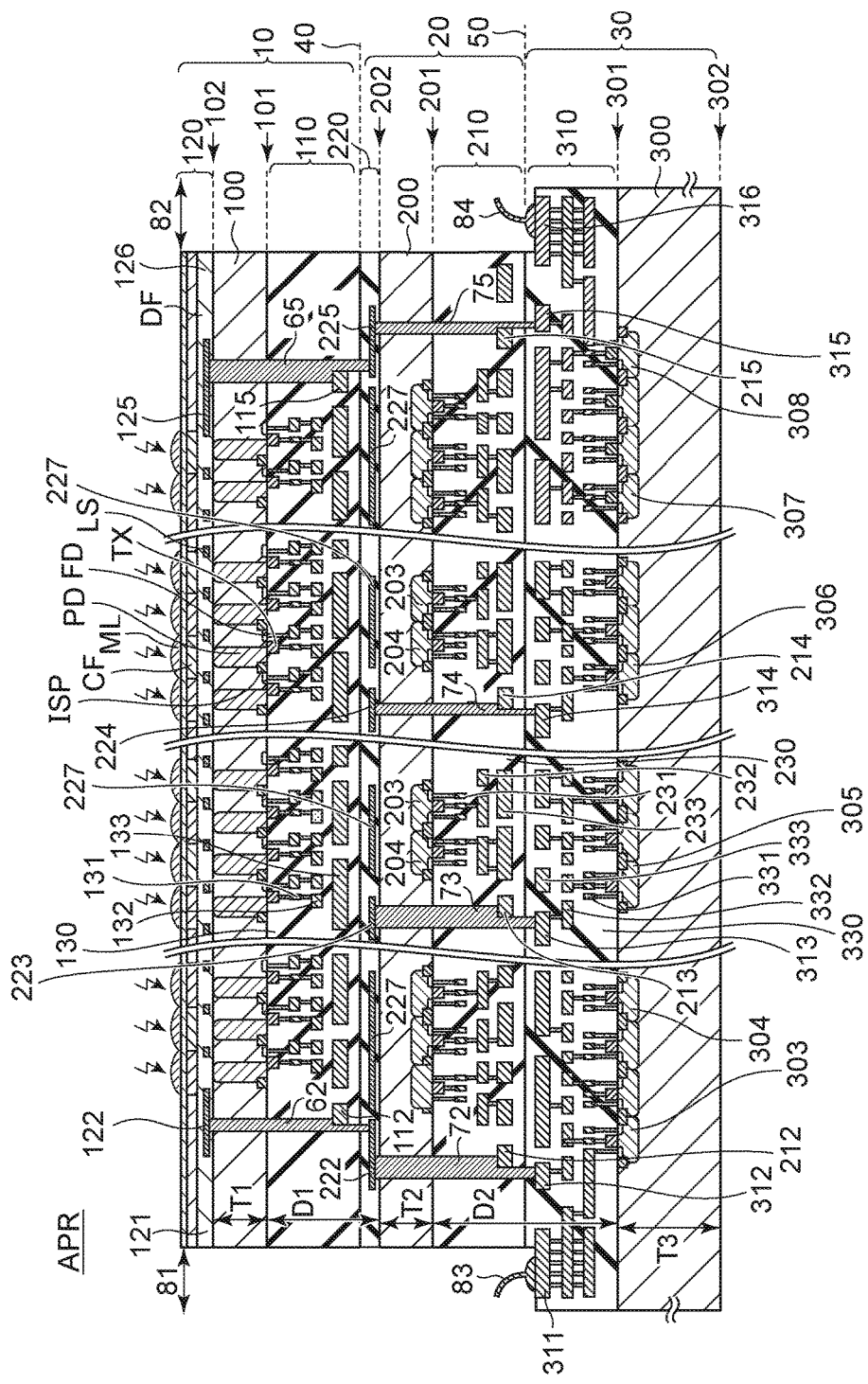
FIG. 7 is a schematic view for explaining a semiconductor apparatus according to an exemplary embodiment of the subject disclosure.

FIG. 7 is a cross-sectional view of the semiconductor apparatus APR according to a fourth exemplary embodiment. Description for points that may be similar to those of the first exemplary embodiment, the second exemplary embodiment, or the third exemplary embodiment will be omitted.

The present exemplary embodiment is different from the third exemplary embodiment in that each of the through electrodes 62 and 65 each of which is constituted by a pair of through electrodes in the third exemplary embodiment is constituted by one through electrode. Similarly, each of the through electrodes 72, 73, 74, and 75 each of which is constituted by a pair of through electrodes in the third exemplary embodiment is constituted by one through electrode. Thereby, it is possible to achieve an effect similar to that of the second exemplary embodiment.

Manufacturing Method of Semiconductor Apparatus

A manufacturing method of the semiconductor apparatus APR will be described. The manufacturing method described here is common among the first to fourth exemplary embodiments.

First, a wafer is prepared for each of the chip 10, the chip 20, and the chip 30. The wafer that is formed into the chip 10 is referred to as an upper wafer, the wafer that is formed into the chip 20 is referred to as a middle wafer, and the wafer that is formed into the chip 30 is referred to as a lower wafer. Each of the wafers includes a semiconductor substrate that is formed into the semiconductor layer 100 or 200 or the semiconductor substrate 300. The semiconductor substrate that is formed into the semiconductor layer 100 of the upper wafer is referred to as an upper semiconductor substrate, the semiconductor substrate that is formed into the semiconductor layer 200 of the middle wafer is referred to as a middle semiconductor substrate, and the semiconductor substrate that is formed into the semiconductor substrate 300 of the lower wafer is referred to as a lower semiconductor substrate. Each of the upper semiconductor substrate, the middle semiconductor substrate, and the lower semiconductor substrate has a plurality of semiconductor elements formed thereon. Moreover, each of the wafers includes, on the semiconductor substrate, a wiring structure that is formed into the wiring structure 110, 210, or 310. The wiring structure that is formed into the wiring structure 110 of the upper wafer is referred to as an upper wiring structure, the wiring structure that is formed into the wiring structure 210 of the middle wafer is referred to as a middle wiring structure, and the wiring structure that is formed into the wiring structure 310 of the lower wafer is referred to as a lower wiring structure.

First, the lower wafer and the middle wafer are bonded so that the lower wiring structure and the middle wiring structure are positioned between the lower semiconductor substrate and the middle semiconductor substrate. Then, the middle semiconductor substrate is thinned from a rear surface side. Thereafter, the through electrodes 71, 72, 73, 74, 75, and 76 are formed so as to pass through the thinned middle semiconductor substrate. Furthermore, a sub-wiring structure that is formed into the wiring structure 220 is formed on the thinned middle semiconductor substrate.

Next, the middle wafer and the upper wafer are bonded so that the sub-wiring structure and the upper wiring structure are positioned between the thinned middle semiconductor substrate and the upper semiconductor substrate. Then, the upper semiconductor substrate is thinned from a rear surface side. Thereafter, the through electrodes 61, 62, 65, and 66 are formed so as to pass through the thinned upper semiconductor substrate. Furthermore, an optical structure that is formed into the optical structure 120 is formed on the thinned upper semiconductor substrate.

Next, the pad openings 81 and 82 are formed so as to pass through the upper semiconductor substrate. Thereafter, the lower semiconductor substrate is thinned. It is possible to thin the lower semiconductor substrate so as to satisfy $2\times(D2+T2+D1+T1)<T3$ and/or $T3<20\times(D2+T2+D1+T1)$ as described above. In a case where the semiconductor apparatus APR is not necessary to be thinned that much, the lower semiconductor substrate does not need to be thinned.

Thereafter, the laminated lower wafer, middle wafer, and upper wafer are diced to be divided into a plurality of semiconductor devices IC. Each of the semiconductor devices IC is mounted on the package PKG and the package PKG and the semiconductor device IC are connected by a connecting member such as the bonding wires 83 or 84, and the semiconductor apparatus APR is completed.

As described in FIGS. 3A and 3B, by arranging through electrodes whose widths are comparatively wide on four sides, it is possible to reduce peeling of a chip or a crack of a chip at a time of dicing, thus making it possible to raise a yield.

A part of the through electrodes 61, 62, 65, and 66 (for example, the through electrodes 61 and 66) in the chip 10 is able to be formed by a process different from that of the other part of the through electrodes 61, 62, 65, and 66 (for example, the through electrodes 62 and 65). It is thereby possible to easily make widths of the through electrodes different in the chip 10. The same applies to the through electrodes 71, 72, 73, 74, 75, and 76 in the chip 20. In a case where all the through electrodes in the chip 10 are formed by the same process, it is also possible to make widths of all the through electrodes in the chip 10 uniform. The same applies to the through electrodes in the chip 20, and, in this case, widths of the through electrodes may be made different for each chip.

Making the widths of the through electrodes 61, 62, 65, and 66 that are formed later different from the widths of the through electrodes 71, 72, 73, 74, 75, and 76 that are formed earlier is advantageous to reduce costs that result at a time of manufacture and raise the yield. For example, when a width of a through electrode is made different for each process, there is no restriction by a process rule that prescribes a minimum width or the like, and a material and time (takt time) that are necessary for formation of the through electrode are able to be saved, so that it is possible to normalize or reduce the costs. Moreover, at a time of connecting the through electrodes 61, 62, 65, and 66 that are formed later to the through electrodes 71, 72, 75, and 76 that are formed earlier, it is possible to reduce connection failure between the upper and lower through electrodes due to an alignment error between the wafers. For example, when both the through electrodes 61, 62, 65 and 66 that are formed later and the through electrodes 71, 72, 75, and 76 that are formed earlier are made fine similarly in order to increase the number of through electrodes, connection failure between the upper and lower through electrodes is likely to be caused by slight misalignment. Therefore, by making one of the upper and lower through electrodes thicker than the other, even when misalignment is caused to some extent, it is possible to appropriately connect the upper and lower through electrodes. Note that, by using the wirings 221, 222, 225, and 226, it is possible to reduce an influence of misalignment between the upper wafer and the middle wafer. On the other hand, for example, when none of the wirings 221, 222, 225, and 226 is used, it is necessary to form the through electrodes 61, 62, 65, and 66 so as to be overlapped on the through electrodes 71, 72, 75, and 76. In this case, making widths of the upper and lower through electrodes different is advantageous to reduce the influence of misalignment.

Equipment Provided with Semiconductor Apparatus

The equipment EQP illustrated in FIG. 2B will be described in detail. In addition to the semiconductor chip IC having the semiconductor substrate 300, the semiconductor apparatus APR may include the package PKG that accommodates the semiconductor chip IC therein. The package PKG may include a base to which the semiconductor chip IC is fixed, a lid that faces the semiconductor chip IC and is made of glass or the like, and a connecting member, such as the bonding wire 83 or 84 or a bump, which connects a terminal provided in the base and a terminal provided in the semiconductor chip IC.

The equipment EQP further includes at least one of the optical system OPT, the control apparatus CTRL, the processing apparatus PRCS, the display apparatus DSPL, and the memory apparatus MMRY. The optical system OPT forms an image in the semiconductor apparatus APR, and includes a lens, a shutter, or a mirror, for example. The control apparatus CTRL controls the semiconductor apparatus APR, and is a semiconductor apparatus such as an ASIC, for example. The processing apparatus PRCS processes a signal output from the semiconductor apparatus APR, and is a semiconductor apparatus, such as a CPU or an ASIC, which configures an AFE (analog front end) or a DFE (digital front end). The display apparatus DSPL is an EL display apparatus or a liquid crystal display apparatus each of which displays information (image) obtained by the semiconductor apparatus APR. The memory apparatus MMRY is a magnetic device or a semiconductor device each of which stores information (image) obtained by the semiconductor apparatus APR. The memory apparatus MMRY is a volatile memory such as an SRAM or a DRAM or a nonvolatile memory such as a flash memory or a hard disk drive. The machine apparatus MCHN includes an operating unit or a driving unit such as a motor or an engine. The equipment EQP displays a signal output from the semiconductor apparatus APR on the display apparatus DSPL and transmits the signal to an outside by a communication apparatus (not illustrated) provided in the equipment EQP. Therefore, the equipment EQP can further include the memory apparatus MMRY and the processing apparatus PRCS separately from the storage circuit unit 21 and the operation circuit unit 31 that are included in the semiconductor apparatus APR.

The equipment EQP illustrated in FIG. 2B may be electronic equipment such as an information terminal (for example, a smartphone or a wearable terminal) which has a photographing function or a camera (for example, a lens interchangeable camera, a compact camera, a video camera, or a monitoring camera). The machine apparatus MCHN in a camera is able to drive a part of the optical system OPT for zooming, focusing, or a shutter operation. Moreover, the equipment EQP may be transport equipment such as a vehicle, a vessel, or a plane. The machine apparatus MCHN in the transport equipment may be used as a moving apparatus. The equipment EQP as the transport equipment is suitable for what transports the semiconductor apparatus APR or assists and/or automates driving (piloting) by the photographing function. The processing apparatus PRCS for assisting and/or automating driving (piloting) is able to perform processing for operating the machine apparatus MCHN as the moving apparatus on the basis of information obtained by the semiconductor apparatus APR.

By using the semiconductor apparatus APR according to the present exemplary embodiment, it is possible to realize reduction in a size and enhancement of performance. Accordingly, when the semiconductor apparatus APR is mounted on the transport equipment and an outside of the transport equipment is photographed or an external environment is measured, it is possible to obtain excellent image quality or measurement accuracy. Moreover, it is possible to enhance reliability so as to mount the semiconductor apparatus APR on the transport equipment. Thus, for manufacturing and selling the transport equipment, deciding to mount the semiconductor apparatus APR of the present exemplary embodiment on the transport equipment is advantageous to enhance performance of the transport equipment.

The exemplary embodiments described above are able to be appropriately modified within a range not departing from the technical idea. Note that, disclosed contents of the exemplary embodiments are not limited to what has been specified in the present specification and include all items that are able to be grasped from the present specification and the drawings attached to the present specification.

According to the present technique, it is possible to provide a semiconductor apparatus that achieves reduction in a size and/or enhancement of performance.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-068690 filed Mar. 30, 2017, which is hereby incorporated by reference herein in its entirety.

What is claimed is:

1. A semiconductor apparatus comprising:
a semiconductor substrate in which a plurality of semiconductor elements are provided;
a first semiconductor layer which is overlapped on the semiconductor substrate and in which a plurality of photoelectric conversion elements are provided;
a second semiconductor layer in which a plurality of semiconductor elements are provided and which is arranged between the semiconductor substrate and the first semiconductor layer;
a first wiring structure that is arranged between the first semiconductor layer and the second semiconductor layer;
a second wiring structure that is arranged between the first wiring structure and the semiconductor substrate; and
a third wiring structure that is arranged between the second wiring structure and the semiconductor substrate, wherein:
the second semiconductor layer is arranged between the first wiring structure and the third wiring structure,
the first semiconductor layer includes a first main surface on a side of the first wiring structure;
the first wiring structure includes a first wiring;
the second semiconductor layer includes a second main surface on a side of the second wiring structure;
the second wiring structure includes a second wiring;
the third wiring structure includes a third wiring;
a through electrode that passes through the first semiconductor layer and reaches the first wiring; and
a through electrode that passes through the second semiconductor layer and reaches the third wiring are further included, and
a width, at a position coplanar with the first main surface, of the through electrode reaching the first wiring is different from a width, at a position coplanar with the second main surface, of the through electrode reaching the third wiring.

2. The semiconductor apparatus according to claim 1, wherein:
the third wiring is electrically connected to the first wiring;
the third wiring structure includes a fourth wiring that is electrically connected to the second wiring; and
the width, at a position coplanar with the first main surface, of the through electrode reaching the first wiring is narrower than the width, at a position coplanar with the second main surface, of the through electrode reaching the third wiring.

3. The semiconductor apparatus according to claim 1, wherein:
the third wiring is electrically connected to the first wiring;
the third wiring structure includes a fourth wiring that is electrically connected to the second wiring; and
the width, at a position coplanar with the first main surface, of the through electrode reaching the first wiring is wider than the width, at a position coplanar with the second main surface, of the through electrode reaching the third wiring.

4. The semiconductor apparatus according to claim 1, wherein the through electrode reaching the first wiring connects a pixel circuit unit that is constituted by the first wiring structure and the first semiconductor layer and a column circuit unit that is constituted by the third wiring structure and the semiconductor substrate.

5. The semiconductor apparatus according to claim 1, wherein the through electrode reaching the first wiring is overlapped on the through electrode reaching the third wiring.

6. The semiconductor apparatus according to claim 1, wherein the second semiconductor layer and the second wiring structure constitute a DRAM cell array.

7. The semiconductor apparatus according to claim 1, wherein a thickness of the second semiconductor layer is thicker than a thickness of the first semiconductor layer and thinner than a thickness of the semiconductor substrate.

8. The semiconductor apparatus according to claim 1, wherein a thickness of the semiconductor substrate is greater than twice of a distance from the semiconductor substrate to a surface of the first semiconductor layer, which is opposite to the first main surface, and smaller than 20 times of the distance.

9. Equipment comprising:
the semiconductor apparatus according to claim 1, wherein at least one of an optical system that forms an image in the semiconductor apparatus, a control apparatus that controls the semiconductor apparatus, a processing apparatus that processes a signal output from the semiconductor apparatus, a display apparatus that displays information obtained by the semiconductor apparatus, and a memory apparatus that stores information obtained by the semiconductor apparatus is further included.

10. The semiconductor apparatus according to claim 1, wherein
the third wiring structure includes a fourth wiring, and the semiconductor apparatus further comprises a through electrode that passes through the second semiconductor layer and reaches the fourth wiring.

11. The semiconductor apparatus according to claim 1, further comprising a through electrode that passes through the second semiconductor layer and reaches the second wiring,
wherein the second wiring structure is arranged between the second semiconductor layer and the third wiring structure, and the width, at a position coplanar with the first main surface, of the through electrode reaching the first wiring is different from a width, at a position coplanar with the second main surface, of the through electrode reaching the second wiring.

12. The semiconductor apparatus according to claim 10, wherein the width, at a position coplanar with the first main surface, of the through electrode reaching the first wiring is narrower than a width, at a position coplanar with the second main surface, of a the through electrode reaching the fourth wiring.

13. The semiconductor apparatus according to claim 10, wherein the width, at a position coplanar with the second main surface, of the through electrode reaching the third wiring is wider than a width, at a position coplanar with the second main surface, of the through electrode reaching the fourth wiring.

14. The semiconductor apparatus according to claim 10, wherein the third wiring structure includes a fifth wiring that is connected to a pad included in the first wiring structure, a through electrode that passes through the second semiconductor layer and reaches the fifth wiring is further included, and a width, at a position coplanar with the second main surface, of the through electrode reaching the fifth wiring is wider than the width, at a position coplanar with the first main surface, of the through electrode reaching the first wiring.

15. The semiconductor apparatus according to claim 10, wherein:
the first semiconductor layer includes a pixel region in which the plurality of photoelectric conversion elements are arrayed; and
the through electrode reaching the fourth wiring is arranged between the pixel region and the semiconductor substrate.

16. The semiconductor apparatus according to claim 10, wherein the third wiring structure includes a fifth wiring that is connected to a pad included in the first wiring structure, a through electrode that passes through the second semiconductor layer and reaches the fifth wiring is further included, and a width, at a position coplanar with the second main surface, of the through electrode reaching the fifth wiring is wider than a width, at a position coplanar with the second main surface, of a through electrode reaching the fourth wiring.

17. The semiconductor apparatus according to claim 11, further comprising:
a fourth wiring structure arranged between the second semiconductor layer and the first wiring structure, the fourth wiring structure including a fourth wiring; and
a through electrode that passes through the first semiconductor layer and reaches the fourth wiring,
wherein a width, at a position coplanar with the first main surface, of the through electrode reaching the fourth wiring is different from the width, at a position coplanar with the second main surface, of the through electrode reaching the second wiring.

18. A semiconductor apparatus comprising:
a semiconductor substrate in which a plurality of semiconductor elements are provided;
a first semiconductor layer which is overlapped on the semiconductor substrate and in which a plurality of photoelectric conversion elements are provided;
a second semiconductor layer in which a plurality of semiconductor elements are provided and which is arranged between the semiconductor substrate and the first semiconductor layer;
a first wiring structure that is arranged between the first semiconductor layer and the second semiconductor layer;
a second wiring structure that is arranged between the first wiring structure and the semiconductor substrate; and
a third wiring structure that is arranged between the second wiring structure and the semiconductor substrate, wherein:
the second semiconductor layer is arranged between the first wiring structure and the third wiring structure,
the first semiconductor layer includes a first main surface on a side of the first wiring structure;
the first wiring structure includes a first wiring and a second wiring;
the second semiconductor layer includes a second main surface on a side of the second wiring structure;
the third wiring structure includes a third wiring that is electrically connected to the first wiring and a fourth wiring that is electrically connected to the second wiring;
a through electrode that passes through the first semiconductor layer and reaches the first wiring; and
a through electrode that passes through the first semiconductor layer and reaches the second wiring are included, and
a width, at a position coplanar with the first main surface, of the through electrode reaching the first wiring is different from a width, at a position coplanar with the first main surface, of the through electrode reaching the second wiring.

19. The semiconductor apparatus according to claim 18, wherein the width, at a position coplanar with the first main surface, of the through electrode reaching the first wiring is narrower than the width, at a position coplanar with the first main surface, of the through electrode reaching the second wiring.

20. The semiconductor apparatus according to claim 18, wherein the width, at a position coplanar with the first main surface, of the through electrode reaching the first wiring is wider than the width, at a position coplanar with the first main surface, of the through electrode reaching the second wiring.

21. The semiconductor apparatus according to claim 18, wherein one of the through electrode reaching the first wiring and the through electrode reaching the second wiring is a first through electrode, the other of the through electrode reaching the first wiring and the through electrode reaching the second wiring is a second through electrode,
a width, at a position coplanar with the first main surface, of the first through electrode is wider than a width, at a position coplanar with the first main surface, of the second through electrode, and
a distance between the first through electrode and an outer edge of the first semiconductor layer is shorter than a distance between the second through electrode and the outer edge of the first semiconductor layer.

22. The semiconductor apparatus according to claim 18, further comprising a through electrode that passes through the first semiconductor layer and reaches a fifth wiring included in the second wiring structure, wherein the second wiring structure is arranged between the second semiconductor layer and the first wiring structure.

23. A semiconductor apparatus comprising:
a semiconductor substrate in which a plurality of semiconductor elements are provided;
a first semiconductor layer which is overlapped on the semiconductor substrate and in which a plurality of photoelectric conversion elements are provided;
a second semiconductor layer in which a plurality of semiconductor elements are provided and which is arranged between the semiconductor substrate and the first semiconductor layer;
a first wiring structure that is arranged between the first semiconductor layer and the second semiconductor layer;
a second wiring structure that is arranged between the first wiring structure and the semiconductor substrate; and
a third wiring structure that is arranged between the second wiring structure and the semiconductor substrate, wherein:
the second semiconductor layer is arranged between the first wiring structure and the third wiring structure,
the first semiconductor layer includes a first main surface on a side of the first wiring structure;
the first wiring structure includes a first wiring;
the second semiconductor layer includes a second main surface on a side of the second wiring structure;
the second wiring structure includes a second wiring;
the third wiring structure includes a third wiring and a fourth wiring;
a through electrode that passes through the second semiconductor layer and reaches the third wiring; and
a through electrode that passes through the second semiconductor layer and reaches the fourth wiring, and a width, at a position coplanar with the second main surface, of the through electrode reaching the third wiring is different from a width, at a position coplanar with the second main surface, of the through electrode reaching the fourth wiring.

24. The semiconductor apparatus according to claim 23, wherein the width, at a position coplanar with the second main surface, of the through electrode reaching the third wiring is wider than the width, at a position coplanar with the second main surface, of the through electrode reaching the fourth wiring.

25. The semiconductor apparatus according to claim 23, wherein the width, at a position coplanar with the second main surface, of the through electrode reaching the third wiring is narrower than the width, at a position coplanar with the second main surface, of the through electrode reaching the fourth wiring.

26. The semiconductor apparatus according to claim 23, wherein one of the through electrode reaching the first wiring and the through electrode reaching the second wiring is a first through electrode, the other of the through electrode reaching the first wiring and the through electrode reaching the second wiring is a second through electrode, a width, at a position coplanar with the first main surface, of the first through electrode is wider than a width, at a position coplanar with the first main surface, of the second through electrode, and a distance between the first through electrode and an outer edge of the second semiconductor layer is shorter than a distance between a through electrode and the outer edge of the second semiconductor layer.

27. Equipment that includes a machine apparatus, further comprising:

the semiconductor apparatus according to claim 23; and a processing apparatus that performs, on a basis of information obtained by the semiconductor apparatus, processing for operating the machine apparatus.

28. The semiconductor apparatus according to claim 23, further comprising a through electrode that passes through the second semiconductor layer and reaches the second wiring, wherein the second wiring structure is arranged between the second semiconductor layer and the third wiring structure.

29. The semiconductor apparatus according to claim 23, further comprising:

a through electrode that passes through the second semiconductor layer and reaches the second wiring included in the second wiring structure, and a through electrode that passes through the second semiconductor layer and reaches a fifth wiring included in the second wiring structure, wherein a width, at a position coplanar with the second main surface, of the through electrode reaching the second wiring is different from the width, at a position coplanar with the second main surface, of the through electrode reaching the fifth wiring.

30. The semiconductor apparatus according to claim 29, further comprising a through electrode that passes through the second semiconductor layer and reaches the second wiring included in the second wiring structure, wherein a width, at a position coplanar with the second main surface, of the through electrode reaching the second wiring is different from the width, at a position coplanar with the second main surface, of the through electrode reaching the third wiring.

* * * * *